(12) United States Patent
Soule et al.

(10) Patent No.: US 7,581,303 B2
(45) Date of Patent: Sep. 1, 2009

(54) METHOD OF MANUFACTURING A CHASSIS ASSEMBLY TO REDUCE ELECTROMAGNETIC INTERFERENCE

(75) Inventors: Nancy Soule, Ramona, CA (US); Brian Kash, San Diego, CA (US); Andrew Poynot, San Diego, CA (US)

(73) Assignee: The DIRECTV Group, Inc., El Segundo, CA (US)

( * ) Notice: Subject to any disclaimer, the term of this patent is extended or adjusted under 35 U.S.C. 154(b) by 390 days.

(21) Appl. No.: 11/528,229

(22) Filed: Sep. 27, 2006

(65) Prior Publication Data

US 2007/0019368 A1 Jan. 25, 2007

Related U.S. Application Data

(62) Division of application No. 10/607,744, filed on Jun. 27, 2003, now Pat. No. 7,132,609.

(51) Int. Cl.
*B23P 17/04* (2006.01)

(52) U.S. Cl. .............................. 29/592; 29/521; 29/825; 29/874; 174/366; 174/369; 174/377; 174/387; 312/223.2; 312/263; 312/265.5; 312/265.6

(58) Field of Classification Search .................. 29/592, 29/521, 825, 874; 174/366, 369, 377, 387, 174/816; 312/223.2, 263, 265.5, 265.6
See application file for complete search history.

(56) References Cited

U.S. PATENT DOCUMENTS

| | | | |
|---|---|---|---|
| 5,992,955 A * | 11/1999 | Yang | 312/265.6 |
| 6,194,653 B1 | 2/2001 | McMiller et al. | |
| 6,550,877 B1 * | 4/2003 | Anderson et al. | 312/223.2 |
| 6,627,812 B2 | 9/2003 | Kim et al. | |

* cited by examiner

*Primary Examiner*—Thiem Phan

(57) ABSTRACT

A method of manufacturing a chassis assembly to reduce electromagnetic interference is disclosed. The method includes forming a chassis having a chassis cover top portion, a chassis cover step portion, a chassis cover pre-step portion, a hemmed edge, a hemmed lip, and one or more dimpled spring fingers, by forming a first bend at the hemmed edge residing between the hemmed lip and the chassis cover pre-step portion, forming a second bend between the chassis cover step portion and the chassis cover pre-step portion, and forming a third bend between the chassis cover top portion and the chassis cover step portion. The method further including forming a fourth bends between a chassis back top portion and a chassis back. The formed chassis cover is then seated with the chassis back to create a tortuous path.

4 Claims, 9 Drawing Sheets

METHOD OF MANUFACTURING A CHASSIS ASSEMBLY TO REDUCE ELECTROMAGNETIC INTERFERENCE

CROSS-REFERENCE TO RELATED APPLICATION

The present application is a divisional of U.S. patent application Ser. No. 10/607,744 filed Jun. 27, 2003 now U.S. Pat. No. 7,132,609, by Nancy Soule, Brian Kash and Andrew Poynot, entitled "CHASSIS SPRING FINGER TORTUOUS PATH WITH IMPROVED MANUFACTURABILITY", which is incorporated by reference herein.

FIELD OF THE INVENTION

The invention is related to manufacturing enclosure assemblies for reducing electromagnetic interference. More particularly, the invention is related to a system and method for reducing electromagnetic interference in enclosure assemblies through the use of spring fingers and a tortuous path which the electromagnetic wave must follow to leave or enter the enclosure assembly.

BACKGROUND OF THE INVENTION

Electro-magnetic compatibility (EMC) is defined as "the ability of a device, equipment or system to fiction satisfactorily in its electromagnetic environment without introducing intolerable electromagnetic disturbances to anything in that environment" (IEEE C63.12-1987). As has been shown through many anecdotal incidents, EMC has not always been achieved. Examples include the interference between a notebook PC and testing equipment, a printer and a desktop PC, or a cellular telephone and medical devices. These and other pairs of electronic devices often experience electromagnetic interference (EMI).

The operation of many electrical and electronic devices involves the changing of voltage or current levels either intermittently or continuously, sometimes at fast rates. This results in the development of electromagnetic energy at discrete frequencies and across band of frequencies. The offending circuit radiates this energy into the surrounding environment. EMI, therefore, can be defined as any electromagnetic disturbance that interrupts, obstructs or otherwise degrades or limits the effective performance of electronics and/or electrical equipment. If can be induced intentionally, as in electronic warfare, or, more commonly, unintentionally, as a result of spurious emissions and responses, intermodulation products and the like. EMC is what the engineer attempts to, design into a device, as a result of EMI.

EMI has two paths to follow when leaving or entering an electronic circuit: a radiated path and a conducted path. The radiated signal will leak out of (or into) gaps, slots, opening and other discontinuities that may be present in the housing structure (enclosure or shield). Conducted signals travel over power, signal and control lines leaving the housing where they are free to radiate in open space, causing interference. Conversely, conducted signals can travel into the housing in the same manner.

Shielding effectiveness (SE) is used to evaluate the suitability of a shield. Expressed in terms of decibels (wherein the field reduction is expressed as $$-20\log\left(\frac{FS_2}{FS_1}\right) dB;$$

where "FS" refers to "Field Strength, in volts-per-meters squared), the formulae is:

$$SE_{db} = A + R + B$$

where:
A=Absorption loss (dB);
R=Reflection loss (dB); and
B=Correction factor (dB) (for multiple reflections in thin shields).

For example, a basic shield might reduce the emergent field to one-tenth of the initial strength, i.e., an SE of 20dB. A demanding application might require a reduction to one-hundred thousandth of the initial field strength, or shielding effectiveness of 100 dB.

Absorption loss is the amount of energy strength dissipated as the wave travels through the shield. The formula for absorption loss is stated as:

$$A_{db} = 1.314(f \cdot \sigma \cdot \mu)^{1/2} \cdot t$$

where:
f=frequency (MHz);
$\mu$=permeability relative to cooper;
$\sigma$=conductivity relative to copper; and
t=shield thickness in centimeters.

Reflection loss (near-field) depends on the nature of the source of the wave and the distance from that source. For a rod, or straight wire antenna, the wave impedance is higher near the source and falls as distance from the source is increased, but levels out at the plane wave impedance (377 $\Omega$).

In contrast, if the source is a small wire loop, the field is predominately magnetic, and the wave impedance is low near the source. The impedance increases with distance away from the source, but levels out at 377 $\Omega$ at distances beyond approximately one-sixth of a wavelength.

Reflection loss varies according to the ratio of wave-to-shield impedance, so it will depend not only on the type of wave, but also on how far the shield is from the source. An example would be small, shielded equipment.

Reflection loss in the near field can be calculated as:

$$R(\text{Electric})db = 321.8 - (20 \cdot \log r) - (30 \cdot \log f) - (10 \cdot \log (\mu/\sigma)); \text{ and}$$

$$R(\text{Magnetic})db = 14.6 + (20 \cdot \log r) = (10 \cdot \log f) = (10 \cdot \log (\mu/\sigma))$$

where:
r=distance from source to shield;
f=frequency (MHz);
$\mu$=permeability relative to copper; and
$\sigma$=conductivity relative to copper.

The final component of the SE equation is the calculation of the correction factor, B. The formula is:

$$B_{db} = 20 \log 10 \, (-\exp(2t/\sigma)).$$

This is normally calculated only for magnetic near-field conditions and only if the absorption loss is less than 10 dB. Re-reflection within the barrier, due to the absence of significant absorption, results in increased energy passing through the second face of the barrier. Thus the correction factor is a negative, indicating a reduction in shielding effectiveness.

For higher frequency electric fields, good shielding effectiveness can usually be achieved by the use of thin metal shielding as the case material or lining, but the assumption is that the shield is continuous and fully surrounds the sensitive items without gaps or apertures (a Faraday cage).

The difficulty in designing a case structure is that openings are unavoidable. Seams needed for manufacturing, access panels and doors, ventilation openings, windows for outside monitoring, and panel mounted components all penetrate the shielded housing, which effectively lowers the shielding performance of the case. Although slots and gaps are unavoidable, paying attention to the slot length as it relates to the wavelength of the operating frequency of the circuit can be beneficial in shielding design.

At a gap length of one-half the radiating wavelength (i.e., the cut-off frequency), the RF wave starts to attenuate at a rate of 20 dB per decade ($1/10^{th}$ of the cut-off frequency) or 6 dB per octave (½ of cut-off frequency). The highest frequency of RF emission is usually the most critical because it has the smallest wavelength. When considering the highest frequency, it is important to take into account any harmonics that may be present; generally only the first and second harmonics are considered.

Once the frequency at which an enclosure is radiating RF energy is known, and at what level, it is possible to calculate the maximum permitted gap, slot or hole in an enclosure. For example, if 26 dB of attenuation is required at 1 GHz and the wavelength at 1 GHz is 300 mm, the gap or slot will start to attenuate at 150 mm. Therefore, at 1 GHz, the gap should be no larger than: 15 mm ($1/10$th) for 20 dB of attenuation, and 3.75 mm (½) for 32 dB of attenuation. A suitable conductive gasket can be used to achieve this level of attenuation by limiting the gap to a required minimum size. The table below (Table 1) lists operating frequencies and corresponding slot or gap sizes for 6 dB, 20 dB, or 26 dB attenuation.

TABLE I

| Frequency (f) | Wavelength (I) | Wavelength C/O (1/2l) | −6 dB Slot | −20 dB Slot | −26 dB Slot |
|---|---|---|---|---|---|
| 50 MHz | 6.00 m | 3.00 m | 1.5 m | 300 mm | 150 mm |
| 100 MHz | 3.00 m | 1.50 m | .075 m | 150 mm | 750 mm |
| 200 MHz | 1.50 m | 0.75 m | 37.5 m | 75 mm | 37 mm |
| 400 MHz | 0.75 m | 37 cm | 18.75 cm | 37 mm | 19 mm |
| 600 MHz | 0.5. m | 25 cm | 12.5 cm | 25 mm | 12.5 mm |
| 800 MHz | 37.5 cm | 19 cm | 9.5 cm | 19 mm | 9.5 mm |
| 1 GHz | 30.0 cm | 15 cm | 7.5 cm | 15 mm | 7.5 mm |
| 2 GHz | 15.0 cm | 7.5 cm | 3.75 cm | 7.5 mm | 3.7 mm |
| 3 GHz | 10.0 cm | 5.0 cm | 2.5 cm | 5.0 mm | 2.5 mm |

Welding, brazing or soldering are the obvious choices for joints between sheets that are permanently secured. The metal faces to be joined must be clean to promote complete filing of the joint with conductive metal. Screws or rivets are less satisfactory methods to secure the joints, because permanent low-impedance contact along the joints between the fasteners is difficult to maintain.

Conductive EMI gaskets can also be used to reduce EMI. The friction of the conductive gasket is to reduce any slots, holes or gaps along seams and mating surfaces so that RF energy cannot be radiated. EMI gaskets are a conductive medium to fill apertures in the case and provide a continuous, low-impedance joint. Generally, EMI gaskets are designed to provide a flexible connection between two electrical conductors, enabling currents in each conductor to pass through to the other.

An EMI gasket is selected according to a number of performance criteria, namely:
Shielding effectiveness over the specified frequency range;
Mounting methods and closure forces;
Galvanic compatibility with the housing structure and corrosion resistance to the outside environment;
Operating temperature range; and
Cost.

Most commercially available gaskets provide enough shielding performance to enable a device to meet EMC standards. The key is to design the gasket into the case or housing properly.

An important factor is compression, which yields a high conductivity level between gasket and flanges. Poor conductivity between the opposing flanges through the gasket will result in lower shielding effectiveness. A total lack of contact along any part of the joint results in a thin gap capable of acting as a slot antenna. Such an antenna transmits energy at wavelengths shorter than about 4 times the gap length.

The first step towards ensuring conductivity is to make sure the flange faces are smooth, clean, and treated as necessary to provide conductive surfaces. These surfaces must be masked prior to painting. Then, it is essential that the shielding gasket material is continuously well-bonded to the appropriate flange. The compressibility of the conductive gasket is intended to compensate for any flange irregularity. All gaskets have a minimum contact resistance needed to work effectively. The designer can lower the contact resistance of many gaskets by increasing the compression of the gasket. This, of course, increases the closure force and raises the chances of bowing in the case. Most gaskets work effectively with 30% to 70% compression of their free standing heights. Thus, within the recommended minimum contact, pressure between the two facing low spots is nevertheless enough to ensure the adequate conductivity between the gasket and flanges.

On the other hand, gasket compression should not have to be so high that it induces unnatural compression set, which can lead to gasket contact failure and possible electromagnetic leakage. Flange separation requirements are essential to control gasket compression to the range recommended by the gasket manufacturer. Included in that design is the need to make sure the flanges are sufficiently rigid so as not to bow significantly between flange fasteners. In some cases, additional fasteners may be needed to prevent bowing in the case structure.

Compression set also is an important characteristic for joints that may be cycled, such as doors or access panels. If a gasket is prone to take a compression set, then the shielding performance will decrease with each cycle of the door panel. The gasket will require higher compression forces to achieve the shielding levels equivalent to a new gasket. In most applications, this is not possible, and a long-lasting EMI solution is needed. If the case or flange is plastic with a conductive coating, the addition of an EMI gasket should not pose too many problems. However, the designer must consider the abrasion that many gaskets will impart on a conductive surface. Metal gaskets in general tend to be more abrasive on the coated surface. This will reduce the shielding effectiveness of the gasket joint over time and could pose problems in the future.

If the case or flange structure is metal, a gasket can be added by masking off flange surfaces before finishing materials are applied. The use of a conductive mask and peel tape works well if the tape is used on both sides of a mating flange, the EMI gasket can be attached by mechanical fasteners, such as a C-fold™ gasket with integral plastic rivets, or pressure-sensitive adhesive (PSA). The gasket is mounted to one side of the flange, which completes the EMI shielded joint.

A wide array of shielding and gasket products is available. These products include beryllium-copper fingers, wire mesh with and without an elastomeric core, expanded metal and oriented wire embedded in an elastomer, conductive elastomers, and metabolized fabric-clad urethane foam gaskets. Most shielding manufacturers supply estimates of shielding effectiveness that can be achieved with the various gaskets. SE is a relative function that depends on aperture, the size of gasket, compression of the gasket and material composition.

Of all the gasket types, fabric-clad-foam gaskets are the newest and some of the most versatile products on the market. These gaskets can be formed in a variety of shapes and thickness from 0.5 mm on up, and can be produced to meet UL flame ratings as well as environmental sealing standards. A new type of gasket, an environmental/EMI hybrid, can eliminate the need for separate single-purpose seals thereby reducing the cost and complexity of the designer's enclosure. These gaskets combine an outer UV-stabilized outer cladding that resists moisture, wind and cleaning agents, with a metabolized, highly conductive interior cladding. Another recent innovation, EMI gaskets with an integral plastic clip, is an attractive alternative to traditional stamped metal gaskets and provides savings in weight, assembly time and cost.

FIGS. 1A and 1B illustrate a prior art electromagnetic interference (EMI) reducing chassis assembly utilizing clamping, and a clamping and gasket design. FIG. 1A illustrates a simple EMI reducing chassis assembly. In FIG. 1A, chassis cover 2 is mated with chassis backing 6 utilizing a nut and bolt assembly 4. The material on the chassis that meets with the material on the chassis backing must be unpainted in order to minimize leakage of electromagnetic waves in to, or out of, the chassis assembly. However, in most circumstances, manufacturers prefer that their chassis assemblies, especially on the exterior, be painted, in order for the product to be more attractive. This may be less true for chassis backings, but, in most circumstances, painted surfaces cannot be avoided. In that case, manufacturing difficulties will ensue because the mating surfaces between the chassis cover and the chassis backing must be free of paint order for good conduction to occur. When good conduction exists, effective electromagnetic interference reduction properties can be realized. Note that nut and bolt assembly 4 are but one means for clamping the chassis cover 2 and chassis backing 6 together. Other methods of clamping than can be used include a simple pressure contact (such that the chassis backing 6 slides into the chassis cover 2), welding or soldering the two chassis components together.

An improvement over the EMI reducing chassis assembly design of FIG. 1A is shown in FIG. 1B in which the same configuration of FIG. 1A is shown except that an EMI reducing gasket material 8 is placed in between the mating surfaces of chassis cover 2 and chassis backing 6. However, in this circumstance, soldering, brazing or welding generally is not acceptable and so some type of nut and bolt assembly 4 must be utilized. However, as discussed above, care must be taken that the nut and bolt assembly do not either squeeze the gasket material too tight, in which case deformation might ensue, causing electromagnetic radiation to leak in or out of the chassis; or, the nut and bolt might not be tightened properly, allowing radiation to be leaked into or out of the chassis, causing the electromagnetic interference.

FIGS. 2A and 2B illustrate another known EMI reducing chassis assembly utilizing a spring finger design, which is an improvement over the designs of FIGS. 1A and 1B. FIGS. 2A and 2B illustrate a known spring finger chassis assembly design for reducing electromagnetic radiation into and out of the electronic products contained within the chassis assembly. In FIG. 2A, chassis cover 2 is mated with chassis backing 6 via spring fingers 10, as shown in FIG. 2B. In FIG. 2B, a plurality of spring fingers 10 are placed all along the exterior of the top of chassis backing 6. Conversely the spring fingers 10 can also be placed on the mating surface of chassis cover 2. In either event, the spring fingers are compressed when the chassis backing 6 is placed in contact with chassis cover 2. This causes a tight fit between the two components, discouraging interference-causing-radiation from leaking out of, or admitted into the electronic products within the chassis assembly. While this known design is effective and can be easier and less costly to manufacturer than the prior art design shown in FIG. 1A or 1B, difficulty arises with multiple removals of chassis backing 6. In some circumstances, spring fingers 10 can become easily bent and then subsequently broken, causing large gaps between the mating covers and consequential EMI to be leaked into and out of the electronic product located within the chassis assembly. Replacing bent or broken spring fingers 10 on the chassis backing 6 or chassis cover 2 can significantly increase the cost of manufacturing.

FIGS. 3A through 3C illustrate a further known design for reducing the generation of, or susceptibility to, electromagnetic interference. In FIG. 3A, chassis cover 2 and chassis backing 6 are configured similar to the configuration illustrated in FIG. 1A, except that chassis cover 2 is placed underneath the top part of chassis backing 6. Nut and bolt assembly 4 (or other means of securing chassis cover 2 and chassis backing 6) is then used to join the two together. This configuration is known as a "simple tortuous path", which is an improvement over the configuration illustrated in either FIG. 1A or FIG. 2A. In the simple tortuous path configuration illustrated in FIG. 3C (which is an expanded view of FIG. 3A), electromagnetic radiation that travels in to, or out of, the interior of the chassis has to make at least two turns (first turn 12 and second turn 14). In FIG. 3B, additional electromagnetic interference protection is afforded by gasket material 8. Again, any electromagnetic interference would have to travel through at least two turns and through the gasket material 8.

Significant problems ensue from the configurations illustrated and discussed above in reference to FIGS. 1, 2, and 3. One such problem is ease of manufacturing. If simple nut and bolt assemblies are used to join the components, then expensive machinery must be fabricated to perform this, or it must be done manually, which also can be expensive. Including gasket material 8 further complicates both attempts at automation and manual installation. Applying the correct amount of torque to the nut and bolt assembly, or applying the right amount of solder or weld (with or without the gasket) further complicates the process. Additionally, none of these methods assures minimizing electromagnetic radiation from the chassis assembly at a low cost, which is desired in the manufacturing environment.

The amount of electromagnetic interference that can be caused by an electronic device is governed by 47 CFR 15, Sections 15.1 through 15.525 (47 CFR parts 0-199 describe the role and responsibility of the Federal Communications Commission (FCC)). Such requirements are stringently tested by independent laboratories (e.g., Underwriter's Laboratory (UL™)), as well as by the manufacturers. If devices are found not to be in compliance with 47 CFR 15, penalties and recalls may ensue, both of which are very costly. Thus, it has been shown that there is a need for a low cost, simple method of manufacturing a chassis assembly in which electromagnetic interference emitted from the electronic devices located within the chassis assembly is reduced to the lowest amount possible, yet, cost as little as possible in manufacturing the assembly.

Thus, it has been shown that a need exists to provide an effective, less costly and easy-to-manufacture electronics enclosure that reduces EMI as much as is practically possible. Additionally, a need exists to do this without imposing additional manufacturing steps or unnecessary constraints on the final product.

SUMMARY OF THE INVENTION

An object of the present invention is to substantially solve at least the above problems and/or disadvantages and to provide at least the advantages described below. Accordingly, it is an object of the present invention to provide a cover and chassis design that provides better EMI performance with 12 protected spring fingers along a hemmed front lip on the cover that seats below a contact rail on the front of the chassis, creating not only 12 points of contact, but a tortuous path to hinder EMI leakage (into or out of the chassis) as well. Because of the hemmed front lip, this design also allows the use of pre-painted sheet metal.

The purpose of the chassis and cover in accordance with an embodiment of the invention is to provide an enclosure for the printed circuit board (PCB), provide grounding, and prevent electromagnetic radiation from entering or exiting the set top box.

The objectives of the present invention are substantially met by a chassis assembly for reducing electromagnetic interference from and to the interior of the chassis assembly, in which the chassis assembly comprises a chassis cover and a chassis back. The chassis cover comprises a plurality of spring contacts and hemmed lips. The chassis back comprises a portion adapted to mate with the chassis cover, such that an interior surface of the chassis back is in secure physical contact with one or more of the plurality of spring contacts, and wherein the hemmed lip provides a tortuous path to any electromagnetic radiation disposed to enter or leave the chassis assembly.

BRIEF DESCRIPTION OF THE DRAWINGS

The novel features believed characteristic of the invention are set forth in the appended claims. The invention itself, however, as well as other features and advantages thereof will be best understood by reference to the detailed description of the preferred embodiments which follows, when read in conjunction with the accompanying drawings, in which:

DETAILED DESCRIPTION OF THE PREFERRED EMBODIMENTS

Figure 1A:
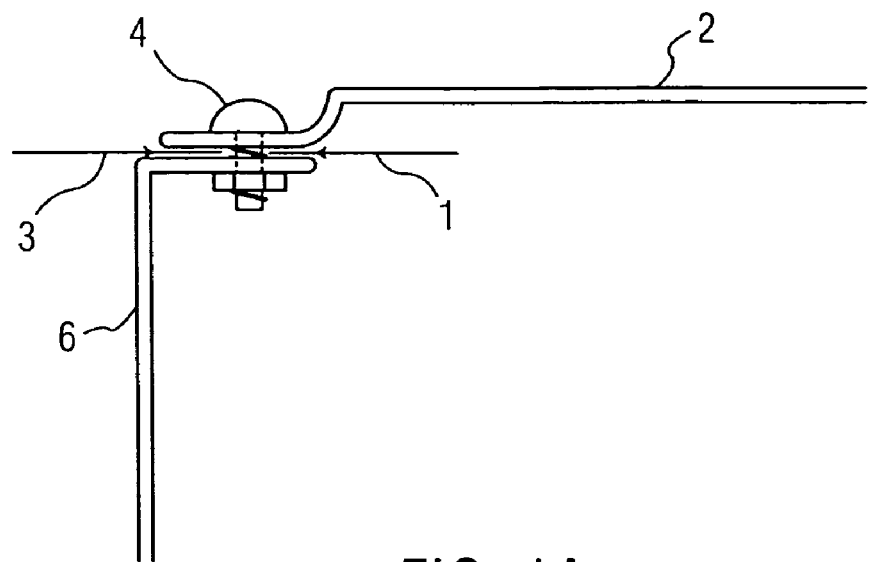
FIGS. 1A and 1B illustrate a known electromagnetic interference (EMI) reducing chassis assembly utilizing clamping, and a clamping and gasket design.
Figure 1B:
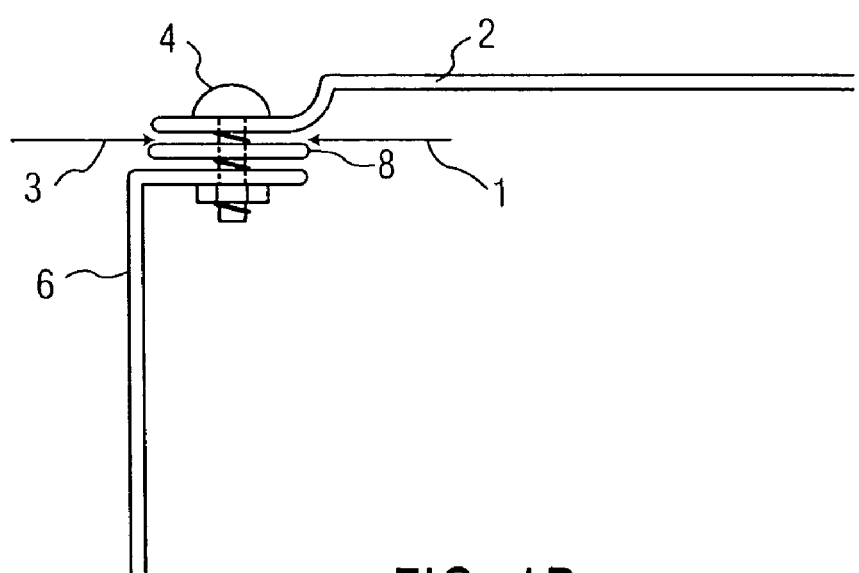
Figure 2A:
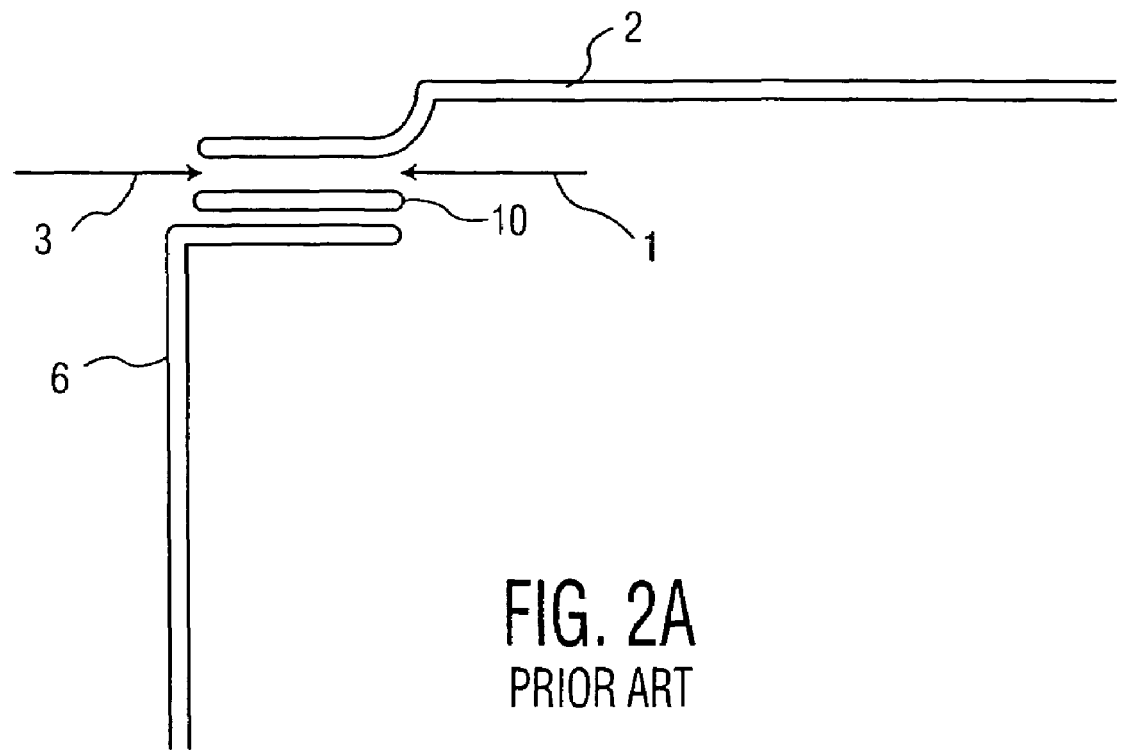
FIGS. 2A and 2B illustrates a known EMI reducing chassis assembly utilizing a spring finger design.
Figure 2B:
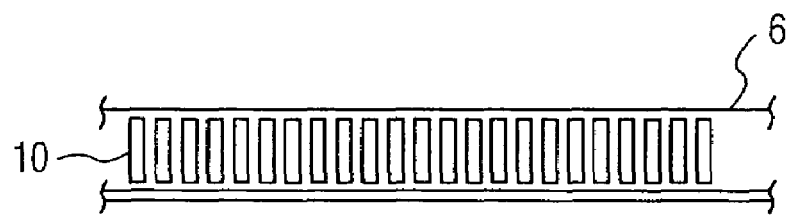
Figure 3A:
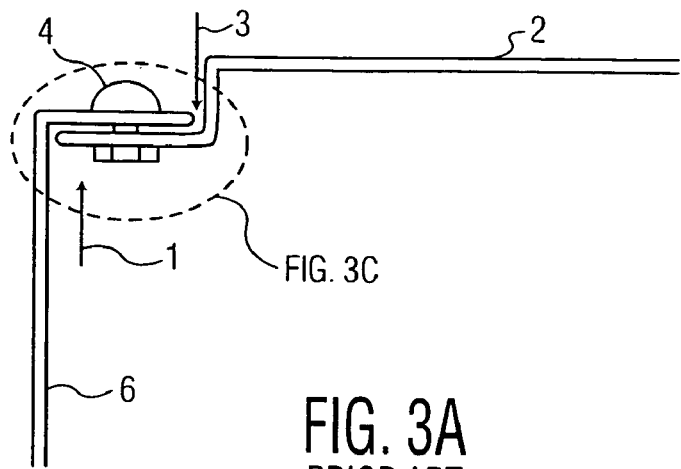
FIGS. 3A, 3B and 3C illustrate a known EMI reducing chassis assembly utilizing a tortuous path, and a tortuous path and gasket design.
Figure 3B:
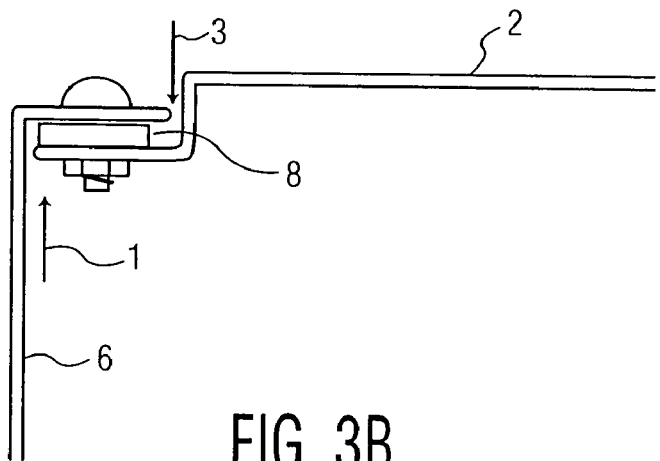
Figure 3C:
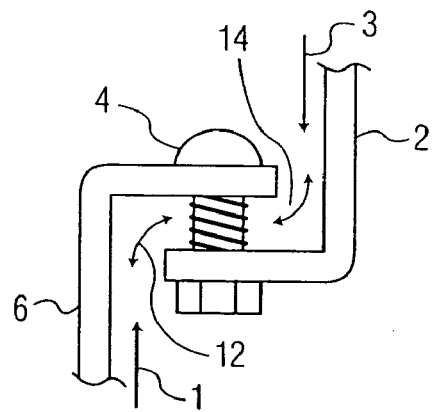

Several embodiments of the present invention will now be described in detail with reference to the annexed drawings. In the drawings, the same or similar elements are denoted by the same reference numerals even though they are depicted in different drawings. In the following description, a detailed description of known functions and configurations incorporated herein have been omitted for conciseness.

Figure 4:
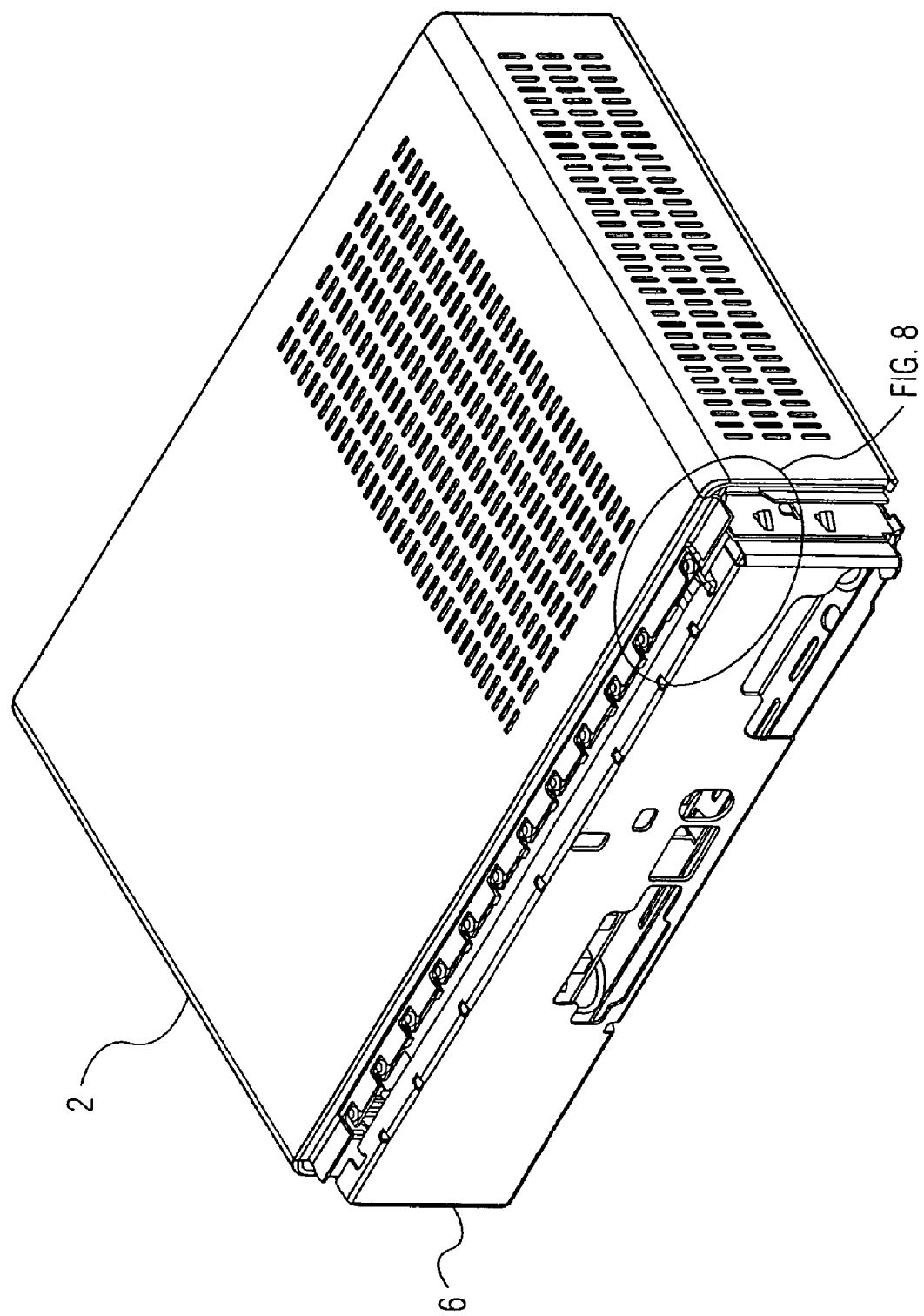
FIG. 4 illustrates a perspective view of a nearly completely assembled chassis assembly incorporating a tortuous path for electromagnetic radiation in accordance with an embodiment of the invention.
Figure 5:
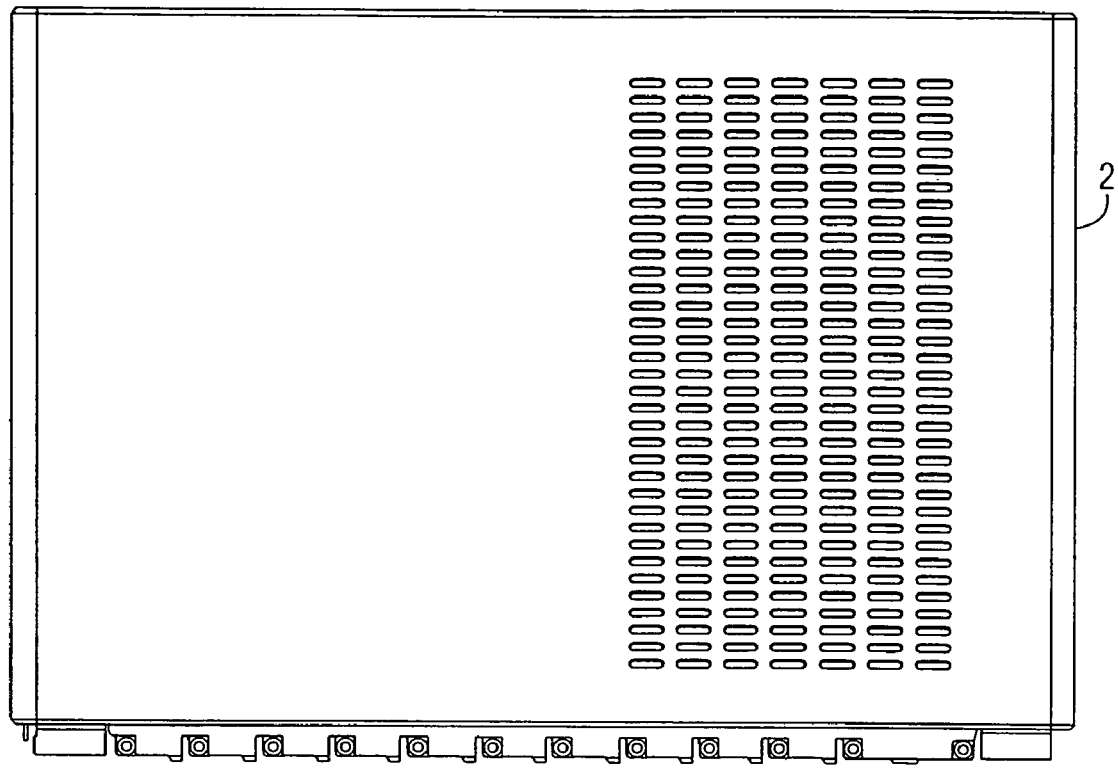
FIGS. 5 and 6 illustrate a top and left side view respectively of the chassis cover shown in FIG. 4.
Figure 6:
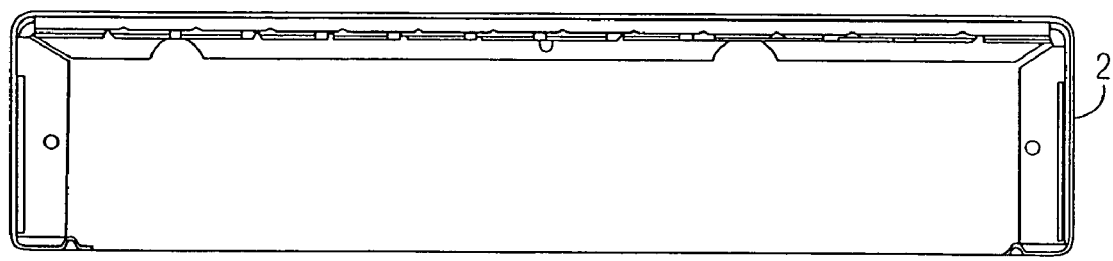

FIGS. 4 through 6 illustrate certain views of a chassis assembly which incorporates the tortuous path for incoming and outgoing electromagnetic radiation in accordance with an embodiment of the invention. Specifically, FIG. 4 illustrates a perspective view of a nearly completely assembled chassis assembly. The chassis assembly is comprised of cover 2 and chassis back 6. The form of this chassis assembly, i.e., a cover slidably interconnected with a chassis back, is well known and widely used by various manufacturers of electronic equipment. However, what has not been practiced before and what the assembly illustrated in FIG. 4 incorporates, is the tortuous path design of dimpled spring fingers and hemmed edges, which are more fully described in greater detail below. FIGS. 5 and 6 illustrate top and left side views respectively of the chassis cover 2 shown in FIG. 4.

Figure 7A:
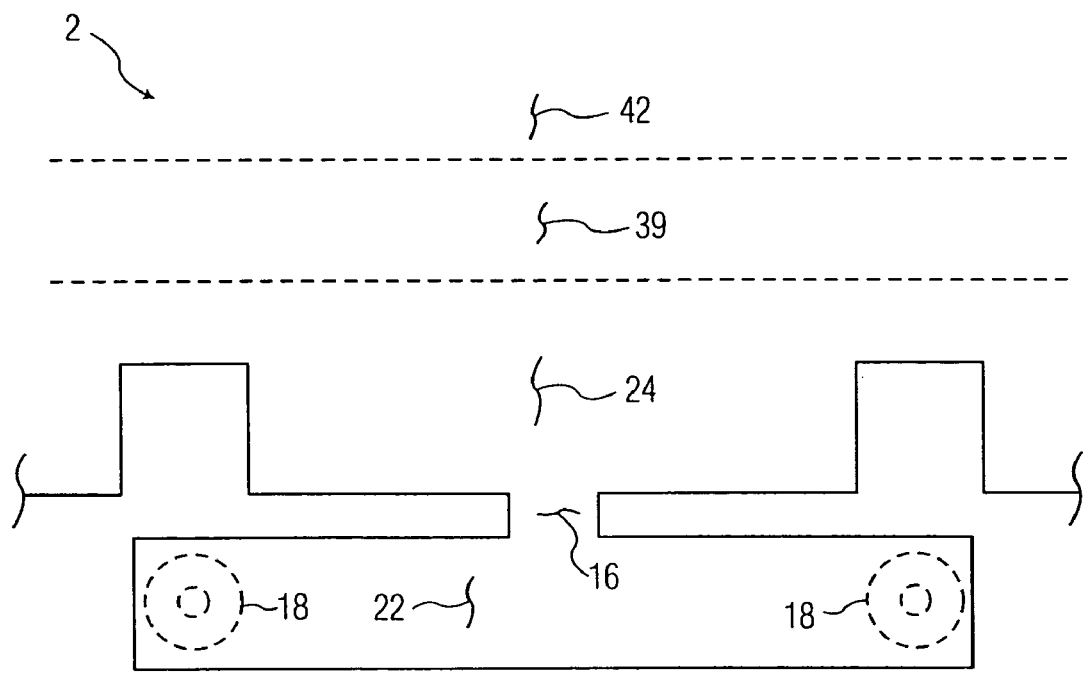
FIGS. 7A through 7F illustrate an EMI reducing chassis assembly utilizing a hemmed edge and dimpled spring finger design in accordance with an embodiment of the invention.
Figure 7B:
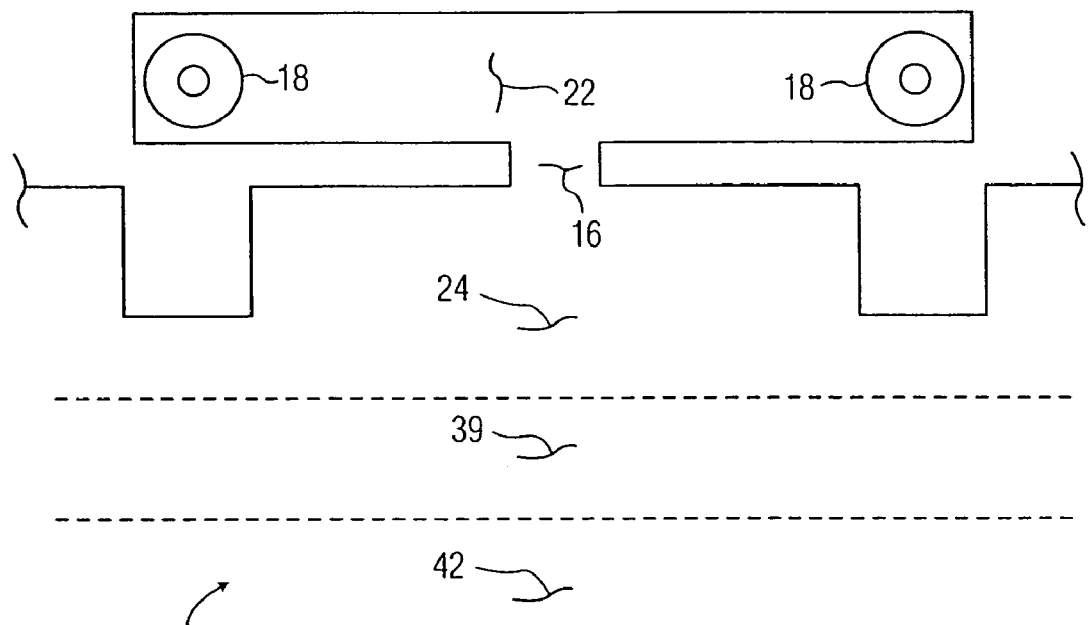
Figure 7C:
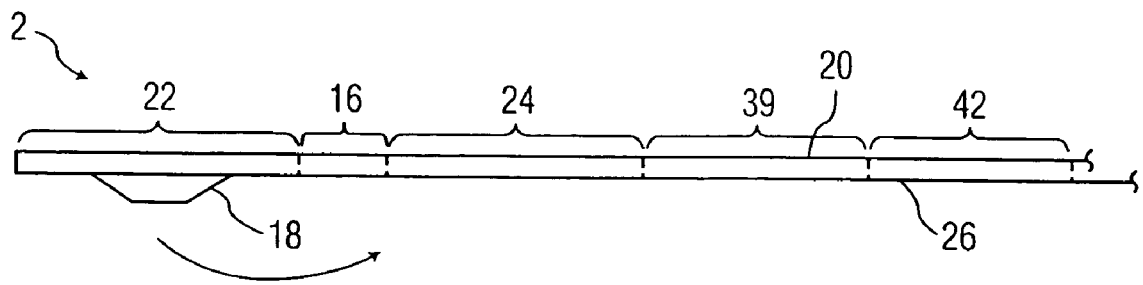
Figure 7D:
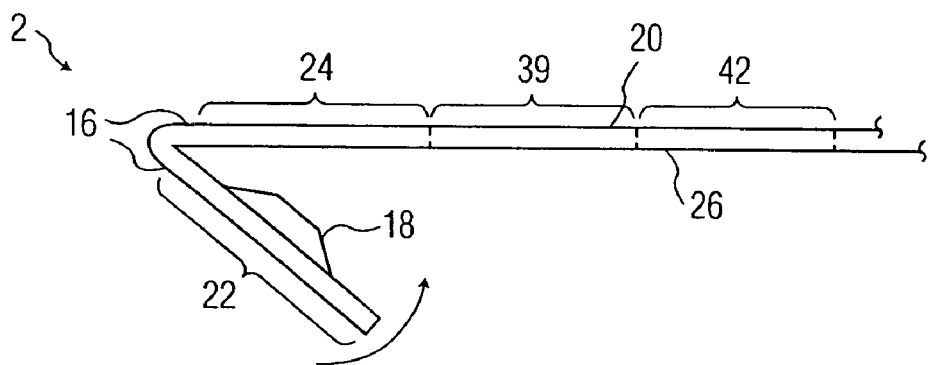

FIGS. 7A through 7E illustrate an example of a process for forming the tortuous path of the chassis assembly shown in FIGS. 4-6 in accordance with an embodiment of the invention. In FIG. 7A, hemmed edge 16 is the point where hemmed lip 22 is bent to form the hemmed assembly. This is fifth bend 26. This is illustrated in FIGS. 7C and 7D. FIG. 7B illustrates the chassis cover interior 26, which is unpainted. This is the "underside" of chassis cover exterior 20. In a typical manufacturing environment, chassis cover 2 is stamped from sheet metal, which can be painted, but normally is not (because the stamping would then affect the painted surface). After stamping, the sheet metal forms are then cleaned and painted. Final bends are then made (this includes the sides of the chassis cover 2, and the hemmed edge assembly). Touch-up painting may follow, depending on the severity of the bend, and quality of the painting step. FIG. 7C illustrates a side view of chassis cover 2. The arrow in FIG. 7C indicates the direction the bend will occur. In FIG. 7D, the bend is shown to be approximately three-quarters finished, and hemmed lip 22 is rotating through an arc back under the chassis cover exterior 20. Dimpled spring finger 18 will protrude above the surface of the chassis cover exterior 20 when it is completely rotated (approximately 180°) via fifth bend 26 of hemmed edge 16. Thus, fifth bend 26 is at or about 180°.

Figure 7E:
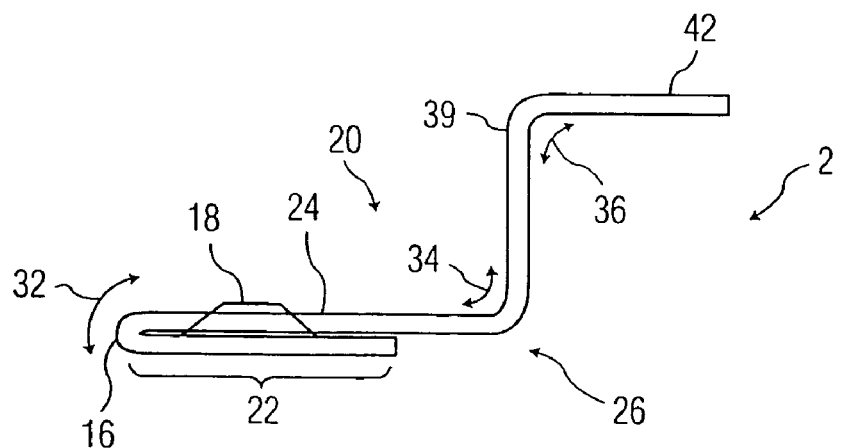
Figure 8:
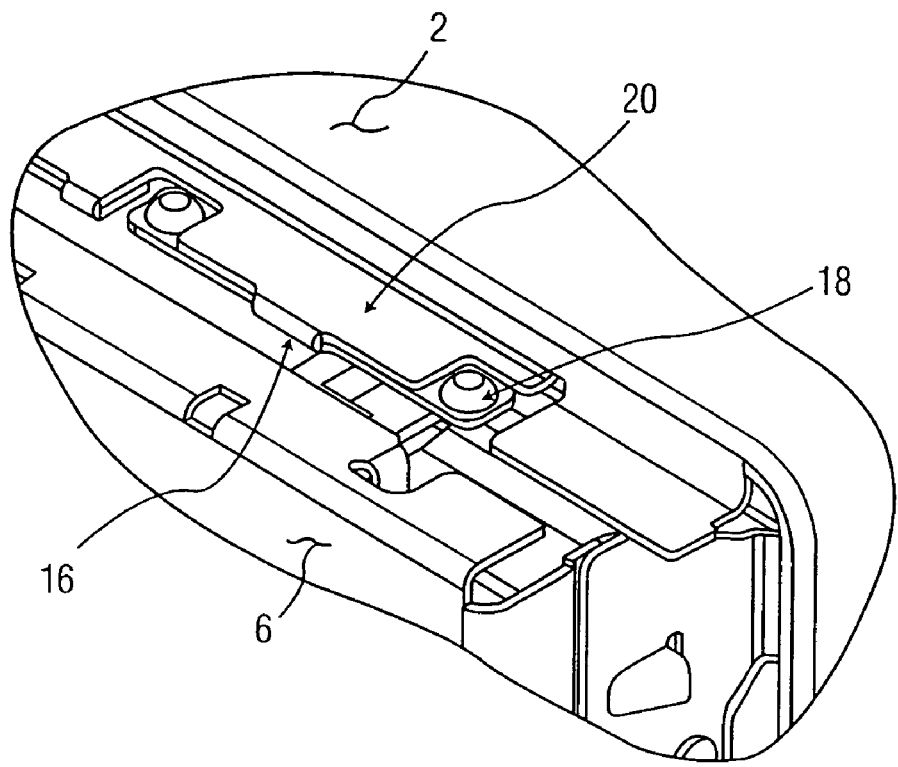
FIG. 8 illustrates a detail view of an EMI reducing chassis assembly in accordance with an embodiment of the invention demonstrating contact between the chassis body and the chassis backing.
Figure 9:
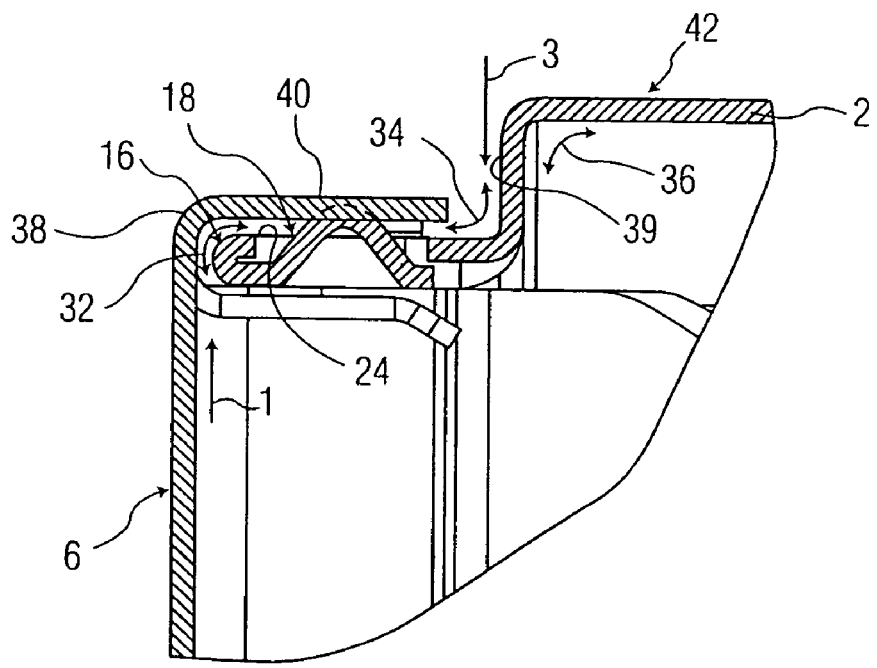
FIG. 9 illustrates a fully assembled section view of the hemmed assembly showing dimpled spring fingers providing electrical conduct between the chassis backing and chassis cover, and further providing a tortuous path for electromagnetic radiation in an accordance with an embodiment of the invention.

Referring to FIG. 7E, chassis cover 2 is bent at a known distance from the hemmed edge 16 at or about 90°, as shown in FIGS. 8 and 9. This bend forms second bend 34. The distance from the hemmed edge 16 second bend 34 is determined from the dimensions of the top portion of chassis back 6, as more clearly seen in FIG. 9. As an additional step in the manufacturing process, a third bend 36 is formed on chassis cover 2. This provides the "step" shape as seen in FIG. 7E. The distances between hemmed edge 16 and second bend 34, and between second bend 34 and third bend 36 are dependent on the specific chassis design.

Figure 7F:
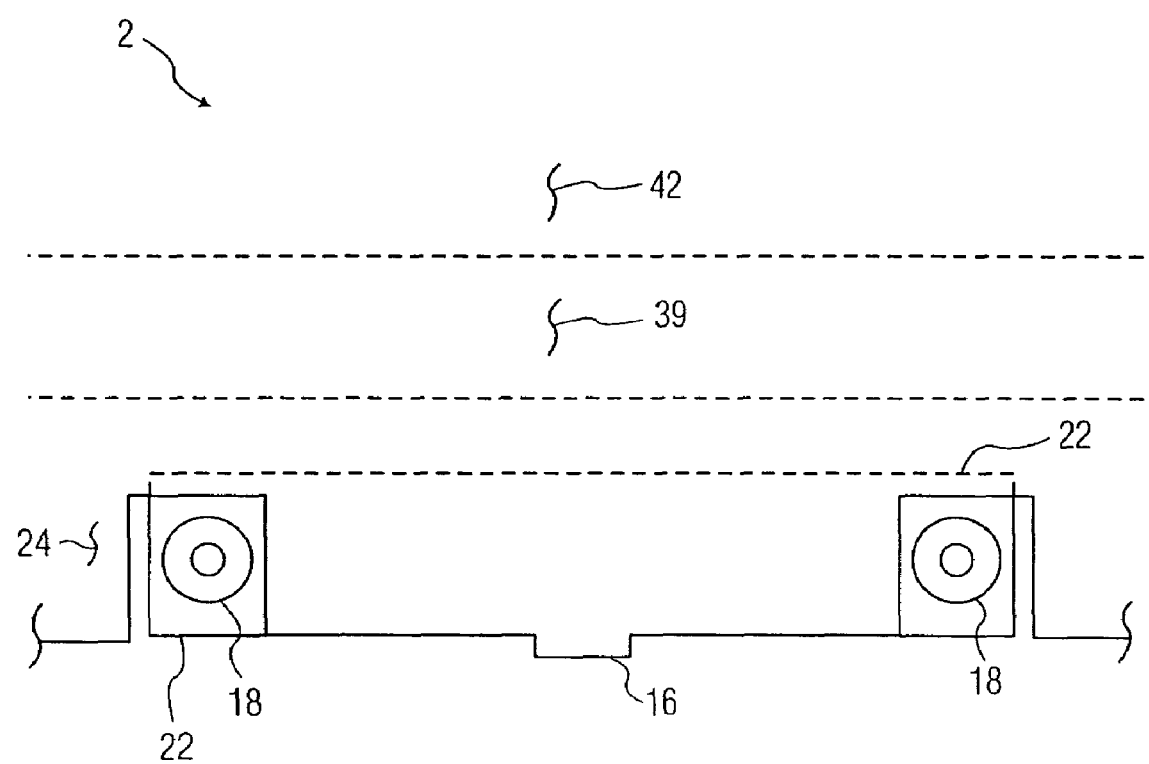

In FIG. 7F, a top view of FIG. 7E, the hemmed lip 22 has been bent underneath the chassis cover exterior so that the dimpled spring finger 18, which was previously pointing down as illustrated in FIG. 7D, is now pointing up, ready to contact the underside of the top of the chassis backing 6. This assures good electrical conductivity in the chassis assembly. The bends create a tortuous path, which provides the minimization of EMI to, and from, the chassis assembly.

The chassis assembly illustrated in FIGS. 4 through 9 provide several advantages over previous chassis cover assembly designs. First, this design creates a tortuous path. Previous designs have had spring fingers on the chassis, with the cover assembling on the top of the chassis spring finger rail. Therefore, if one or more spring fingers were bent, this allowed a direct line of escape (or entrance) for an electromagnetic wave (which could cause EMI). Because the dimpled spring fingers 18 are now located on the cover, the chassis rail is above the dimpled spring fingers 18 which creates what is called the tortuous path. For an electromagnetic wave to leak in or out of the settop box, it must now bounce around two bends.

Referring to FIG. 9, it can be seen that an outgoing electromagnetic wave 1 must travel through first bend 32, which is formed by the union of hemmed edge 16 and fourth bend 38 (of chassis back 6). First bend 32 is formed to be at or about 90°. Then, the outgoing electromagnetic wave 1 travels beneath chassis back top portion 40 (of chassis back 6) and over the top of chassis cover pre-step portion 24 (of chassis cover 2) and it encounters second bend 34. Second bend 34 is formed, during manufacturing, between chassis cover pre-step portion 24 and chassis step portion 39, to be at or about 90°. The outgoing electromagnetic wave 1 (or incoming electromagnetic wave 3) is forced through second bend 34 by the union of chassis back top portion 40, chassis cover pre-step portion 24 and chassis cover step portion 39. Any electromagnetic wave that wishes to leave (or enter) the chassis assembly will encounter first bend 32 and second bend 34.

An additional advantage is provided by the protected dimpled spring fingers 18. In the past, sheet metal spring fingers were easily bent during shipping, handling, and assembly. Since bent spring fingers can allow electromagnetic interference leakage to and from the settop box, by not making contact with their mating box, fixtures are often put in place in the manufacturing floor to bend all spring fingers backing into place prior to assembly. This design, in accordance with an embodiment of the invention, has a protective hemmed edge 16 on the chassis cover 2 which wraps around the dimpled spring fingers 18, protecting them from bending during shipping and handling. A chassis assembly designed in accordance with an embodiment of the invention no longer requires a fixture in place on the assembly to re-bend the spring fingers, thereby reducing manufacturing costs.

Further, use of this assembly design in accordance with the embodiments of the invention allows the chassis cover 2 to be pre-painted. Because the dimpled spring fingers 18 are bent around in a hem, this allows the under side of the sheet metal on the chassis cover 2 to be used as a dimpled spring finger 18 that contacts the chassis back 6. This allows the use of pre-paint or pre-vinyl on the top surface 26 of the chassis cover 2, which is a substantial cost savings to a post paint process with masked spring fingers.

This design for a settop box is used by Hughes Network System, in their Helix™ product line, which is a DirecTV™ set top box. Currently, a tool is used on the production line on every Gaither™ set top box chassis to ensure that the spring fingers are in a position such that contact will be made with the mating cover. On average, the use of this tool costs the factory $110,000 per year.

The TivO™ product, model number HDVR2, utilizes a spring tab design on their cover to ensure contact to the chassis. While these tabs are well protected during shipping and handling, the design does not incorporate a tortuous path. If there was a single tab that did not make contact with the chassis, a potential path for EMI leakage could develop. A chassis assembly designed in accordance with the embodiments of the invention incorporates not only well protected dimpled spring fingers 18, but also a tortuous path making it very difficult for EMI to escape (or enter). It also allows for the use of pre-painted sheet metal.

FIG. 8 illustrates a detail view of an EMI reducing chassis assembly designed and build in accordance with an embodiment of the invention, demonstrating contact between the chassis cover 2 and the chassis back 6. FIG. 9 illustrates a fully assembled section view of the hemmed assembly showing dimpled spring fingers 18 providing electrical conduct between the chassis back 6 and chassis cover 2, and further providing a tortuous path for electromagnetic radiation in accordance with the embodiments of the invention.

In FIG. 9, the painted surface is located on top of the chassis cover 2 and the dimpled spring fingers 18 are not painted, because they are relied upon to be the contact surface with the interior of chassis back 6. Chassis back 6 slides over the hem assembly (comprised of hemmed edge 16, hemmed lip 22, dimpled spring fingers 18 and chassis cover pre-step portion 24), the underside of the chassis back top portion 40, and contacts the top of dimpled spring finger 18, thereby producing good electrical conductivity between the chassis back 6 and chassis cover 2. As described above, a tortuous path to any electromagnetic waves wishing to enter or escape the chassis assembly is also provided. Any electromagnetic radiation disposed to exit the chassis assembly (e.g., outgoing electromagnetic wave 1), must first pass through first bend 32, and then second bend 34. Conversely, any electromagnetic wave disposed to enter the chassis assembly (e.g., incoming electromagnetic wave 3), must first pass through second bend 34, and then first bend 32.

As the chassis cover 2 slides over the hem assembly (described above) of chassis cover 2, hemmed edge 16 slides under chassis back top portion 40 until they two are fully seated. In one embodiment of the invention, hemmed lip 22 of the chassis cover 2 includes 12 dimpled spring fingers 18 to create the under side of the hemmed lip 22, though, as one skilled in the art can appreciate, the number of dimpled spring fingers 18 is a design choice, and depends on many factors. Because the dimpled spring fingers 18 are folded under the chassis back top portion 40 along the hemmed lip 22, they are well protected during shipping and handling, eliminating factory handling issues. On each of these dimpled spring fingers 18 is a dimple that makes contact to the mating surface on the chassis (the underside of chassis back top portion 40) as shown in the fully assembled section view (FIG. 9). This not only guarantees 12 points of contact (as one example) between the chassis back 6 and chassis cover 2, but also creates a tortuous path, forcing electromagnetic waves to make two turns before escaping or entering the chassis assembly. Also, since the dimpled spring fingers 18 are folded up under the hemmed lip 22, this allows the use of pre-painted sheet metal because the underside of the sheet metal (which is not painted) is the contacting surface.

While various embodiments of the invention has been shown and described with reference to the figures thereof, it will be understood by those skilled in the art that various changes in form and details may be made therein without departing from the spirit and scope of the various embodiments of invention as defined by the appended claims.

What is claimed is:

1. A method of manufacturing a chassis assembly, to reduce electromagnetic interference, the method comprising:

forming a chassis cover having a chassis cover top portion, a chassis cover step portion, a chassis cover pre-step portion, a hemmed edge, and a hemmed lip comprising one or more dimpled spring fingers;

forming a third bend between the chassis cover top portion and the chassis cover step portion;

forming a second bend between the chassis cover step portion and the chassis cover pre-step portion;

forming a first bend at the hemmed edge, wherein the hemmed edge resides between the hemmed lip and the chassis cover pre-step portion;

forming a chassis back having a chassis back top portion and a chassis back portion;

forming a fourth bend between the chassis back top portion and the chassis back portion; and seating the formed chassis cover with the chassis back to create a tortuous path.

2. The method according to claim 1, wherein seating the formed chassis cover with the chassis back comprises:

sliding the hemmed edge under the chassis back top portion, such that the one or more dimpled spring fingers is in contact with an underside of the chassis back top portion, providing electrical conductivity.

3. The method according to claim 2, wherein the tortuous path comprises:

a path formed by the second bend, the portion between the underside of the chassis back top portion and a top of the chassis cover pre-step portion, and the first bend.

4. The method according to claim 1, wherein:

the second, third and fourth bends are at or about 90°; and
the first bend is at or about 180°.

* * * * *